United States Patent
Song et al.

(10) Patent No.: US 8,009,492 B2
(45) Date of Patent: Aug. 30, 2011

(54) CIRCUIT FOR GENERATING DATA STROBE SIGNAL AND METHOD

(75) Inventors: Choung-Ki Song, Gyeonggi-do (KR); Sang-Sie Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 93 days.

(21) Appl. No.: 12/614,950

(22) Filed: Nov. 9, 2009

(65) Prior Publication Data
US 2011/0002180 A1      Jan. 6, 2011

(30) Foreign Application Priority Data
Jul. 1, 2009    (KR) .................. 10-2009-0059824

(51) Int. Cl.
*G11C 7/00*           (2006.01)
(52) U.S. Cl. ...... 365/193; 365/194; 365/226; 365/233.1
(58) Field of Classification Search .......... None
See application file for complete search history.

(56) References Cited

U.S. PATENT DOCUMENTS

| 6,498,766 | B2 * | 12/2002 | Lee et al. ............ 365/189.15 |
| 6,819,602 | B2 * | 11/2004 | Seo et al. ................ 365/193 |
| 7,804,734 | B2 * | 9/2010 | Koo et al. ............ 365/230.06 |

FOREIGN PATENT DOCUMENTS

| KR | 1020030078307 | 10/2003 |
| KR | 1020040093858 | 11/2004 |
| KR | 1020050059921 | 6/2005 |
| KR | 1020090067795 | 6/2009 |

OTHER PUBLICATIONS

Notice of Allowance issued from Korean Intellectual Property Office on Jun. 1, 2011.

* cited by examiner

*Primary Examiner* — Tan T. Nguyen
(74) *Attorney, Agent, or Firm* — IP & T Group LLP

(57) ABSTRACT

A circuit for generating a data strobe signal includes: a control signal generation unit configured to generate a strobe control signal defining an activation time period where a first data strobe signal and a second data strobe signal, which is an inverted signal of the first data strobe signal, are toggled; and a strobe signal output unit configured to output the first and second data strobe signals as a final strobe signal in the activation time period where the strobe control signal is activated.

24 Claims, 6 Drawing Sheets

CIRCUIT FOR GENERATING DATA STROBE SIGNAL AND METHOD

CROSS-REFERENCE TO RELATED APPLICATIONS

The present application claims priority of Korean Patent Application No. 10-2009-0059824, filed on Jul. 1, 2009, which is incorporated herein by reference in its entirety.

BACKGROUND OF THE INVENTION

The present invention relates to a semiconductor designing technology, and more particularly, to a semiconductor memory device for receiving a data strobe signal of a data transmitted thereto and performing a data write operation.

In general, semiconductor memory devices including Double Data Rate Synchronous Dynamic Random Access Memory (DDR SDRAM) use data strobe signals to accurately recognize input data. Data strobe signals are signals outputted along with a data from a chipset and toggling according to the data. Data and external clock signals are transferred from a chipset to the semiconductor memory device through different transmission lines and the difference in the transmission rates of the different transmission lines may cause a data recognition error. Therefore, a chipset transfers a data strobe signal to a semiconductor memory device through a transmission line similar to a transmission line through which a data is transmitted. The semiconductor memory device can accurately recognize the data by using the data strobe signal transferred through the similar transmission line. Herein, the data strobe signal should be secured with setup time and hold time, and it includes a pair of a first data strobe signal and a second data strobe signal. The second data strobe signal is a signal obtained by inverting the first data strobe signal.

FIG. 1 is a block diagram illustrating a typical system structure. Referring to FIG. 1, the system includes a chipset 110 and a semiconductor memory device 130.

The chipset 110 outputs a data DAT, a first data strobe signal DQS, a second data strobe signal /DQS, which is an inverted signal of the first data strobe signal DQS, a first external clock signal CLK, and a second external clock signal /CLK, which is an inverted signal of the first external clock signal CLK, to the semiconductor memory device 130. Herein, the data DAT, the first and second data strobe signals DQS and /DQS, and the first and second external clock signals CLK and /CLK are outputted through corresponding transmitters 112A, 112B and 112C, respectively.

The semiconductor memory device 130 includes a plurality of receivers, which are first to third receivers 132A, 13213 and 132C in the drawing, for receiving output signals of the transmitters 112A, 112B and 112C of the chipset 110, respectively. Herein, the output signals of the transmitters 112A, 112B and 112C are terminated and transferred with a voltage level swinging within a small range based on a termination level. The transferred signals have a voltage range corresponding to power source voltage at outputs of the first to third receivers 132A, 132B and 132C. This signal transfer operation is performed through first and second resistors R1 and R2 connected to output terminals of the transmitters 112A, 112B and 112C and third and fourth resistors R3 and R4 connected to the input terminals of the first to third receivers 132A, 132B and 132C. Herein, the first resistor R1 and the second resistor R2 have the same resistance value and the third resistor R3 and the fourth resistor R4 have the same resistance value in order for the first to fourth resistors R1, R2, R3 and R4 to perform the termination operation.

Meanwhile, a first receiver 132A receives a signal corresponding to the data DAT and transfers an output signal to a first synchronizer 150 through a first delayer 134A. A second receiver 132B receives a signal corresponding to the first and second data strobe signals DQS and /DQS and outputs a signal. The output signal of the second receiver 132B is controlled by a ring-back controller 134B and transferred to the first synchronizer 150. Herein, the first delayer 134A compensates the output signal of the second receiver 132B for a delay time corresponding to a delay time of the ring-back controller 134B.

The ring-back controller 134B removes a glitch phenomenon of a falling data strobe signal DQS_F generated due to noise added to the first and second data strobe signals DQS and /DQS. The glitch phenomenon of a falling data strobe signal DQS_F and detailed circuit and operation of the ring-back controller 134B will be described again hereinafter with reference to FIGS. 5 to 7.

The first synchronizer 150 synchronizes an output signal of the first delayer 134A with an output signal of the ring-back controller 134B. The first synchronizer 150 is in charge of synchronizing the data DAT with the first and second data strobe signals DQS and /DQS. An output signal of the first synchronizer 150 is transferred to a second synchronizer 170, and a third receiver receives a signal corresponding to the first and second external clock signals CLK and /CLK and outputs a signal. The output signal of the third receiver 132C is transferred to the second synchronizer 170 through a second delayer 134C. Herein, the second delayer 134C includes a delay circuit for securing tDQSS defined based on a specification and a delay circuit for compensating for the time when a clock signal is delayed for synchronization operation in the ring-back controller 134B.

Meanwhile, the second synchronizer 170 synchronizes the data that is synchronized with the first and second data strobe signals DQS and /DQS with clock signals outputted from the second delayer 134C and outputs internal data INN_DAT. In other words, the second synchronizer 170 synchronizes the data synchronized with the first and second data strobe signals DQS and /DQS with the first and second external clock signals CLK and /CLK.

FIG. 2 is a waveform diagram describing operation waveforms of signals outputted from the chipset 110 shown in FIG. 1. Referring to FIG. 2, the chipset 110 simultaneously outputs the first data strobe signal DQS and the data DAT to the semiconductor memory device 130 during a write operation. Herein, the first data strobe signal DQS and the data DAT maintain the initial termination level. The data DAT are outputted in a sequence of R0, F0, R1, F1, R2, F2, R3 and F3 to correspond to the first and second data strobe signals DQS and /DQS, respectively. The first data strobe signal DQS and the data DAT maintain the termination level except for a pre-amble section and a section where the data DAT are transferred.

FIG. 3 illustrates the first receiver 132A and the second receiver 132B of FIG. 1 in detail. Referring to FIG. 3, the first receiver 132A receives a data DAT and a reference voltage VREF, performs buffering on them, and outputs a signal iDAT of a logic level corresponding to the buffering result. Herein, the data DAT is inputted to a positive (+) terminal of the first receiver 132A while the reference voltage VREF is inputted to a negative (−) terminal.

Subsequently, the second receiver 132B generates a rising data strobe signal DQSR_R and a falling data strobe signal DQS_F in response to the first and second data strobe signals DQS and /DQS. The second receiver 132B includes a receiver 310 for a rising signal and a receiver 330 for a falling signal. The receiver 310 for a rising signal receives the first data strobe signal DQS through a positive (+) terminal and the second data strobe signal /DQS through a negative (−) terminal and performs buffering on them to thereby generate a rising data strobe signal DQSR_R. The receiver 330 for a falling signal receives the second data strobe signal /DQS through a positive (+) terminal and the first data strobe signal DQS through a negative (−) terminal and performs buffering on them to thereby generate a falling data strobe signal DQSR_F.

FIG. 4 is a waveform diagram describing input and output signals of the receiver 310 for a rising signal and the receiver 330 for a falling signal. As illustrated in FIG. 4, the first data strobe signal DQS and the second data strobe signal /DQS are inputted with an opposite phase to each other. Herein, the receiver 310 for a rising signal generates a rising data strobe signal DQSRR corresponding to the first data strobe signal DQS, while the receiver 330 for a falling signal generates a falling data strobe signal DQS_F corresponding to the second data strobe signal /DQS.

Meanwhile, the waveforms of FIG. 4 show an ideal case where noise does not occur in the first and second data strobe signals DQS and /DQS.

FIG. 5 is a waveform diagram illustrating a case where a glitch phenomenon occurs in the first and second data strobe signals DQS and /DQS of FIG. 4. Referring to FIG. 5, a noise component, such as power noise, may be added to the first and second data strobe signals DQS and /DQS to thereby generate ring-back noise marked as ① in the drawing. In this case, the rising data strobe signal DQS_R and the falling data strobe signal DQS_F cause the glitch phenomenon marked as ②. The glitch phenomenon induces a malfunction of the semiconductor memory device 130. Therefore, the ring-back controller 134B is provided to remove the glitch phenomenon.

FIG. 6 illustrates the ring-back controller 134B of FIG. 1. Referring to FIG. 6, the ring-back controller 134B includes a command decoding unit 610, a repeating unit 630, a shifting unit 650, a delay unit 670, and an output unit 690. The command decoding unit 610 decodes an external command signal CMD and generates a write pulse signal WT_P. The repeating unit 630 amplifies a first external clock signal CLK. The shifting unit 650 shifts the write pulse signal WT_P in response to a clock signal outputted from the repeating unit 630. The delay unit 670 delays a falling data strobe signal DQS_F and outputs a delayed falling data strobe signal D_DQS_F. The output unit 690 generates a final falling data strobe signal FIN_DQS_F in response to a strobe control signal DIS_DQS outputted from the shifting unit 650 and the output signal D_DQS_F of the delay unit 670.

Herein, the shifting unit 650 includes a plurality of flip-flop and the last flip-flop of the shifting unit 650 outputs a signal inputted from the previous flip-flop as the strobe control signal DIS_DQS in response to the output signal D_DQS_F of the delay unit 670.

FIG. 7 is a waveform diagram illustrating major signals of the ring-back controller 134B shown in FIG. 6. Referring to FIG. 7, a ring-back effect occurs in first and second data strobe signals DQS and /DQS as shown in ①, and the glitch phenomenon occurs in a falling data strobe signal DQS_F as shown in FIG. 5. The glitch phenomenon also occurs in a delayed falling data strobe signal D_DQS_F outputted from the delay unit 670 of FIG. 6 as shown in ②.

Meanwhile, when a write command is applied through an external command signal CMD, a write pulse signal WT_P is activated. Generally, the pulse width of the write pulse signal WT_P corresponds to a cycle of the first external clock signal CLK. The write pulse signal WT_P is shifted in the shifting unit 650 and outputted as a signal DIS_P in response to the first external clock signal CLK. Herein, a signal outputted from the last flip-flop of the shifting unit 650 is synchronized with the delayed falling data strobe signal D_DQS_F. In other words, the write pulse signal WT_P is synchronized with the external clock signal CLK, shifted, finally synchronized with the delayed falling data strobe signal D_DQS_F, and outputted as a strobe control signal DIS_DQS. Finally, the delayed falling data strobe signal D_DQS_F is logically combined with the strobe control signal DIS_DQS to become the final falling data strobe signal FIN_DQS_F. The final falling data strobe signal FIN_DQS_F becomes free of the glitch phenomenon by the strobe control signal DIS_DQS.

Herein, a glitch removing operation is not performed onto a rising data strobe signal DQS_R because there is a margin as much as almost a cycle between a rising edge of a rising data strobe signal DQS_R and a rising edge of a clock signal inputted to the second synchronizer 170. In case of a semiconductor memory device having a low operation frequency, it does not have to remove the glitch phenomenon occurring in the rising data strobe signal DQS_R. However, in the circumstances that the operation frequency of a memory device increases, which is the current trend, the glitch phenomenon of the rising data strobe signal DQS_R may also induce a malfunction as well.

Although not illustrated in the drawing, the glitch phenomenon may occur before a pre-amble section. The glitch phenomenon causes a malfunction of receiving a data before a desired time point on the part of the semiconductor memory device 130.

Meanwhile, the output signal DIS_P obtained after shifted in response to the first external clock signal CLK is synchronized with the delayed falling data strobe signal D_DQS_F. To make the synchronization operation performed smoothly, the delay time of the output signal DIS_P obtained after shifted should be the same as the delay time of the delayed falling data strobe signal D_DQS_F. To make the delay times the same, a delay circuit is added. The additional delay circuit should be additionally designed in the second delayer 134C as well to secure tDQSS, and this works as a factor for increasing a chip area of a semiconductor memory device.

However, although the delay circuits are added, it is substantially difficult to make the delay times of the output signal DIS_P obtained after shifted and the delayed falling data strobe signal D_DQS_F the same. Also, since the positions of the delay circuits are different, the delay amount of each delay circuit may differ according to a process, voltage, temperature and the like and this makes it hard not only to perform a synchronization operation between the output signal DIS_P obtained after shifted and the delayed falling data strobe signal D_DQS_F but also secure the tDQSS. After all, when the synchronization is not performed at a desired time point, there is a problem in that the glitch phenomenon caused by the ring-back effect of the first and second data strobe signals DQS and /DQS, and when the tDQSS is not secured, the semiconductor memory device performs a malfunction in that it does not recognize a desired data properly.

SUMMARY OF THE INVENTION

An embodiment of the present invention is directed to providing a semiconductor memory device that generates a strobe control signal based on a first data strobe signal and a second data strobe signal which is an inverted signal of the first data strobe signal, and removes a glitch phenomenon based on the strobe control signal.

In accordance with an aspect of the present invention, there is provided a circuit for generating a data strobe signal, which includes: a control signal generation unit configured to generate a strobe control signal defining an activation time period where a first data strobe signal and a second data strobe signal, which is an inverted signal of the first data strobe signal, are toggled; and a strobe signal output unit configured to output the first and second data strobe signals as a final strobe signal in the activation time period where the strobe control signal is activated.

In accordance with another aspect of the present invention, there is provided a method for generating a data strobe signal, which includes: buffering a first data strobe signal and a second data strobe signal which is an inverted signal of the first data strobe signal; generating a strobe control signal defining an activation time period beginning when the first and second data strobe signals enter a pre-amble section and ending at an inactivation time point of the first and second data strobe signals; and outputting an output signal of the process of buffering the first data strobe signal and the second data strobe signal as a final strobe signal in the activation time period where the strobe control signal is activated.

In accordance with another aspect of the present invention, there is provided a memory system, which includes: a memory control device configured to output a data having a termination level corresponding to a power source voltage and a data strobe signal; and a memory device configured to output a strobe control signal by buffering a reference voltage having a predetermined voltage level and the data strobe signal, generate the data strobe signal as a final strobe signal in an activation period where the strobe control signal is activated, and synchronize the data in response to the final strobe signal.

The semiconductor memory device according to an embodiment of the present invention receives a first data strobe signal and a second data strobe signal, which is an inverted signal of the first data strobe signal, each having a termination level corresponding to a power source voltage, from a chipset and generates a strobe control signal based on the first and second data strobe signals without a synchronization operation of a clock signal. The generated strobe control signal may be used to remove a glitch phenomenon caused by a ring-back effect of the first and second data strobe signals.

Also, delay circuits which are mounted on a conventional semiconductor memory device may be removed by simplifying a circuit for removing a ring-back effect. Therefore, it is possible to minimize a chip area and power consumption of a semiconductor memory device.

DESCRIPTION OF SPECIFIC EMBODIMENTS

Other objects and advantages of the present invention can be understood by the following description, and become apparent with reference to the embodiments of the present invention.

Figure 1:
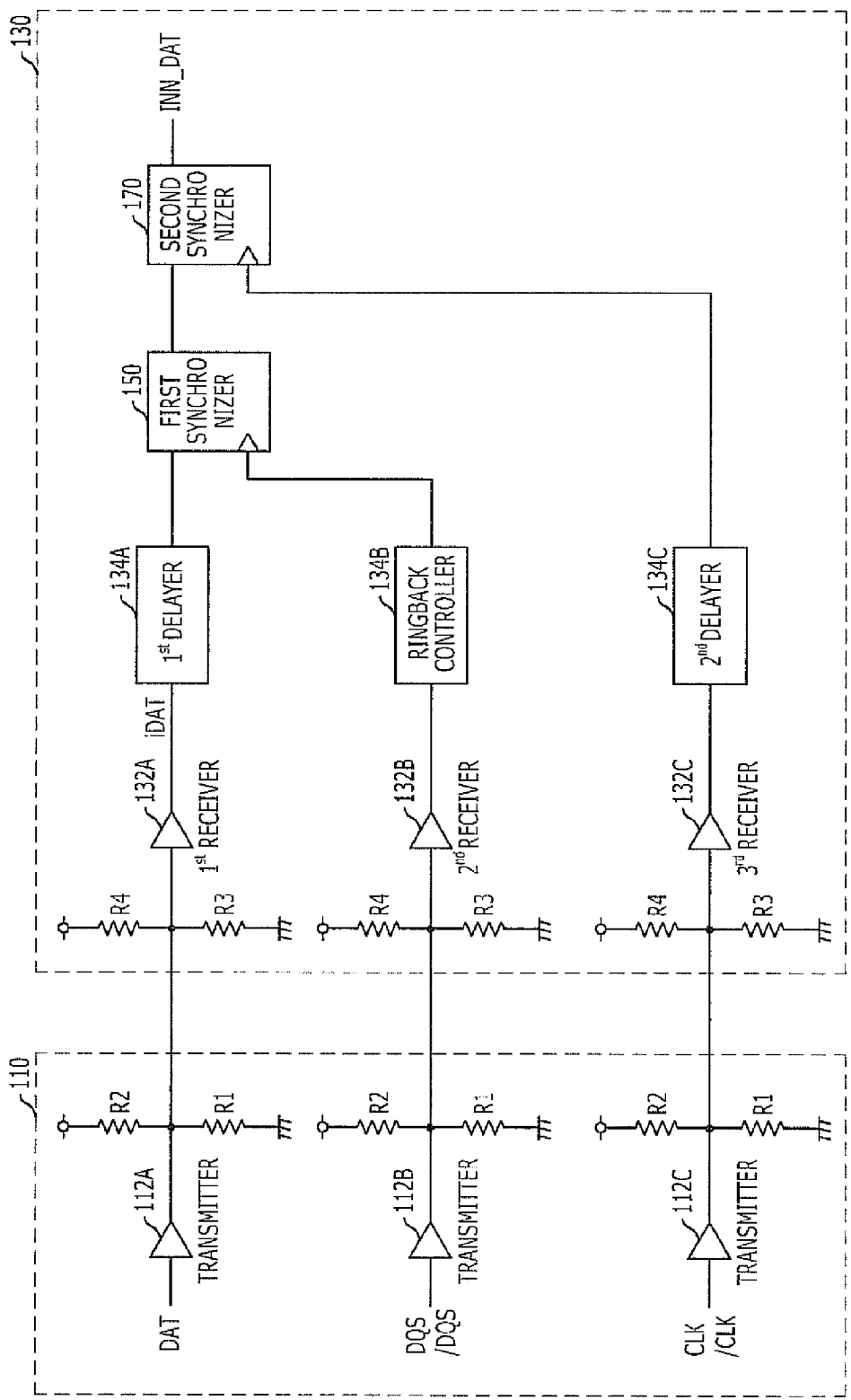
FIG. 1 is a block diagram illustrating a typical system structure.
Figure 2:
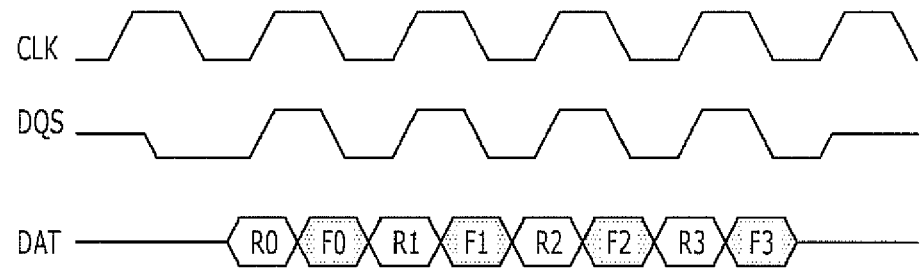
FIG. 2 is a waveform diagram describing operation waveforms of signals outputted from a chipset 110 shown in FIG. 1.
Figure 3:
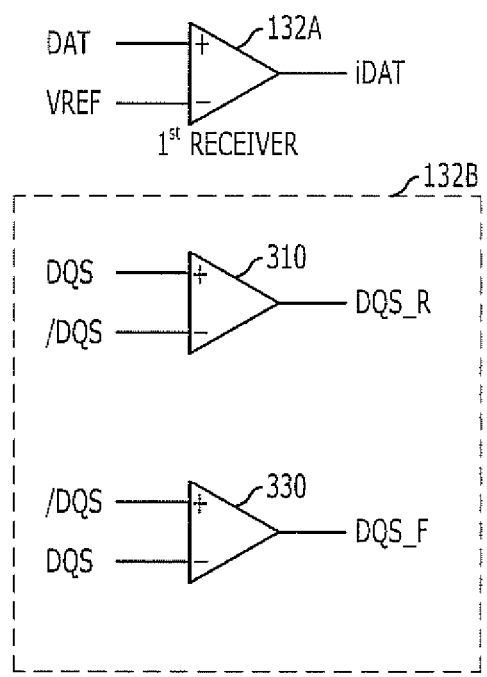
FIG. 3 illustrates a circuit diagram of a first receiver 132A and a second receiver 132B of FIG. 1 in detail.
Figure 4:
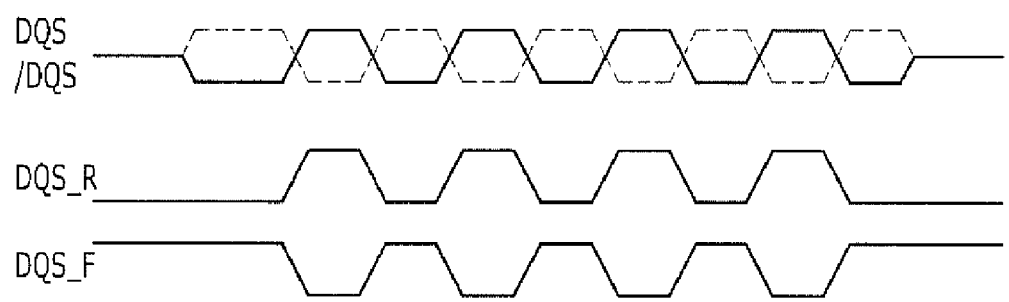
FIG. 4 is a waveform diagram describing input and output signals of a receiver 310 for a rising signal and a receiver 330 for a falling signal.
Figure 5:
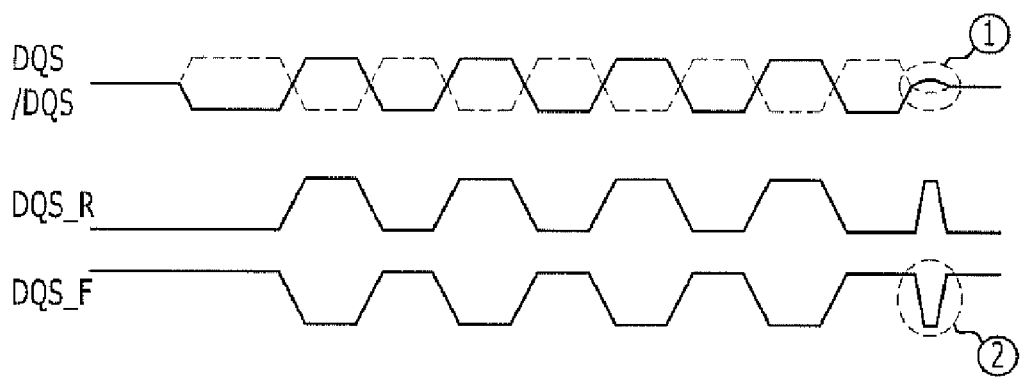
FIG. 5 is a waveform diagram illustrating a case where a glitch phenomenon occurs in first and second data strobe signals DQS and /DQS of FIG. 4.
Figure 6:
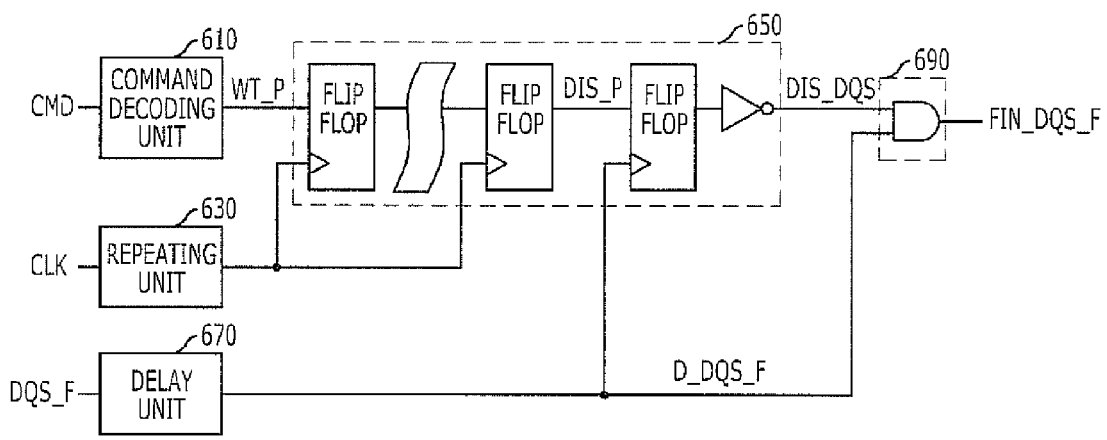
FIG. 6 illustrates a block diagram of a ring-back controller 134B of FIG. 1.
Figure 7:
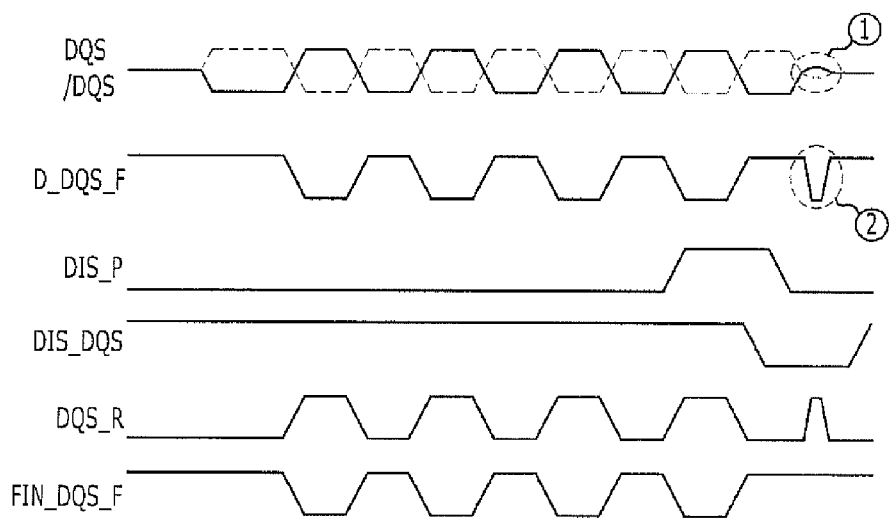
FIG. 7 is a waveform diagram illustrating major signals of the ring-back controller 134B shown in FIG. 6.
Figure 8:
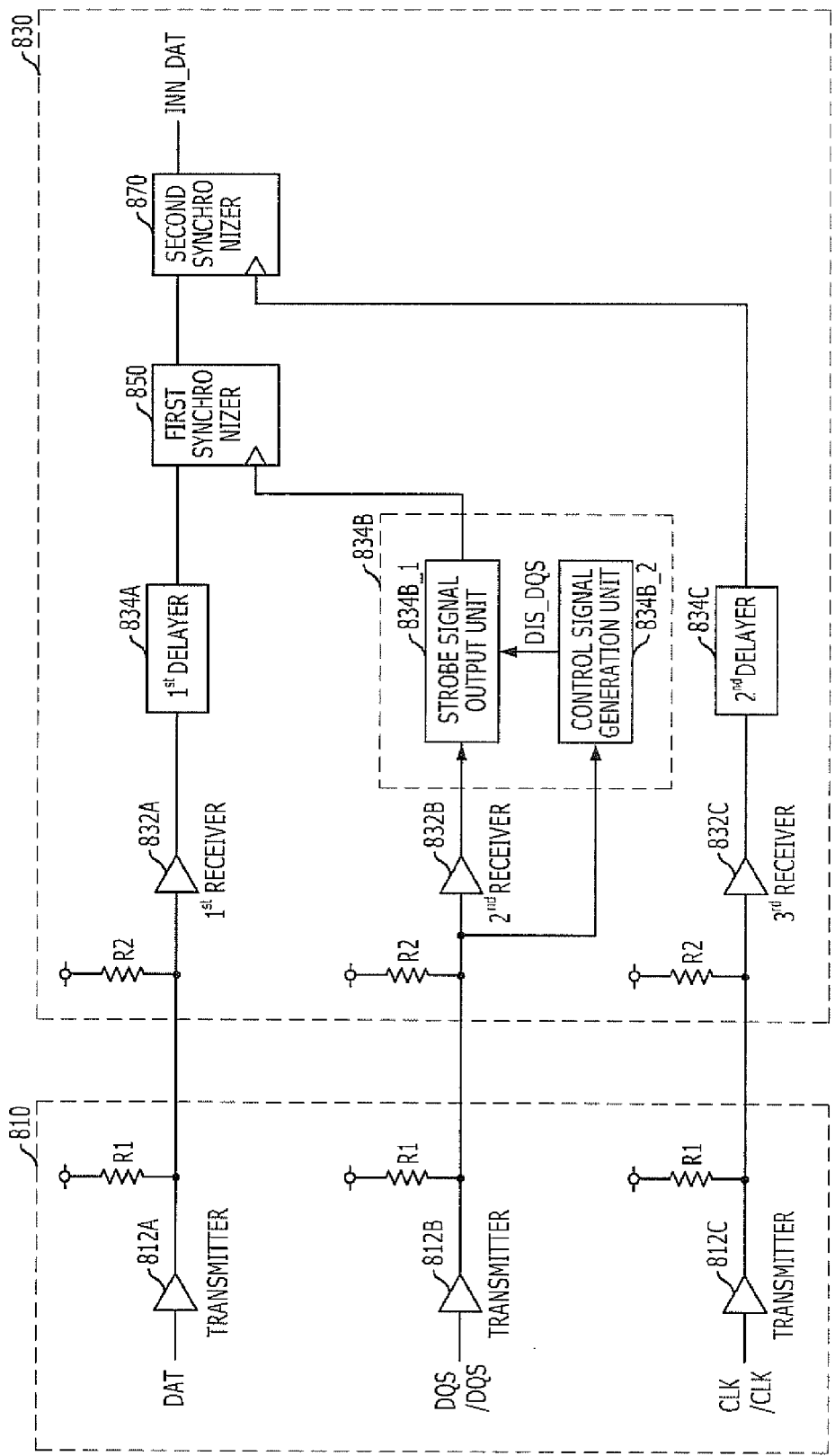
FIG. 8 is a block diagram illustrating a system structure in accordance with an embodiment of the present invention.

FIG. 8 is a block diagram illustrating a system structure in accordance with an embodiment of the present invention. Referring to FIG. 8, a system includes a chipset 810 and a semiconductor memory device 830. The chipset 810 outputs a data DAT, a first data strobe signal DQS, a second data strobe signal /DQS, which is an inverted signal of the first data strobe signal DQS, a first external clock signal CLK, and a second external clock signal /CLK, which is an inverted signal of the first external clock signal CLK, to the semiconductor memory device 830. Herein, the data DAT, the first and second data strobe signals DQS and /DQS, and the first and second external clock signal CLK and /CLK are outputted through first to third transmitters 812A, 812B and 812C, respectively.

The signals outputted from the first to third transmitters 812A, 812B and 812C are transferred based on a termination level corresponding to a power source voltage in order to reduce power consumption. According to a conventional system, an operation performed based on a termination level requires continuous power consumption. The operation waveform for the operation according to an embodiment of the present invention will be described with reference to a waveform diagram to be described below. The termination operation is performed through a termination circuit, which includes a first resistor R1 connected to an output terminal of each of the first to third transmitters 812A, 812B and 812C and a second resistor R2 connected to an input terminal of each of first to third receivers 832A, 832B and 832C. Herein, each resistor is interposed between a transmission line for transferring each signal and a power source voltage.

Meanwhile, the first receiver 832A receives a signal corresponding to a data DAT and an output signal of the first receiver 832A is transferred to a first synchronizer 850 through a first delayer 834A. A second receiver 832B receives a signal corresponding to the first and second data strobe signal DQS and /DQS and an output signal of the second receiver 832B is transferred to the first synchronizer 850 after being controlled by a ring-back controller 834B. Herein, the first delayer 834A compensates the output signal of the second receiver 832B for time corresponding to a delay time of the ring-back controller 834B.

The ring-back controller 834B removes a glitch phenomenon occurring in the output signal of the second receiver 832B caused by a ring-back effect added to the first and second data strobe signals DQS and /DQS. The ring-back controller 834B includes a strobe signal output unit 834B_1 and a control signal generation unit 834B_2.

The strobe signal output unit 834B_1 outputs a strobe control signal DIS_DQS among signals outputted from the second receiver 832B, and the control signal generation unit 834B_2 generates a strobe control signal DIS_DQS in a section where the first and second data strobe signals DQS and /DQS are toggled. According to the conventional technology, a shifting operation based on the first external clock signal CLK and a synchronization operation for synchronizing a shifted signal into a falling data strobe signal DQS_F are performed in order to generate a strobe control signal DIS_DQS, and there is a difficulty in controlling synchronization timing. However, according to an embodiment of the present invention, since the strobe control signal DIS_DQS is generated based on the first and second data strobe signals DQS and /DQS, the operation for controlling a synchronization timing is not required. This will be described in detail hereinafter with reference to FIGS. 9 and 10.

Meanwhile, the first synchronizer 850 synchronizes an output signal of the first delayer 834A with an output signal of the ring-back controller 834B. In other words, the first synchronizer 850 takes charge of synchronizing a data DAT with the first and second data strobe signals DQS and /DQS. Subsequently, an output signal of the first synchronizer 850 is transferred to a second synchronizer 870. The second receiver 832C receives a signal corresponding to the first and second external clock signals CLK and /CLK and outputs a signal to the second synchronizer 870 through a second delayer 834C. Herein, only tDQSS is taken into consideration to design the second delayer 834C. The additional delay circuit which is added due to the synchronization operation of a clock signal does not have to be considered because the first and second data strobe signals DQS and /DQS are used to generate the strobe control signal DIS_DQS.

Meanwhile, the second synchronizer 870 synchronizes the data DAT synchronized with the first and second data strobe signals DQS and /DQS with a clock signal outputted from the second delayer 834C and outputs an internal data INN_DAT. In short, the second synchronizer 870 is in charge of synchronizing the data synchronized with the first and second data strobe signals DQS and /DQS with the first and second external clock signals CLK and /CLK.

Figure 9:
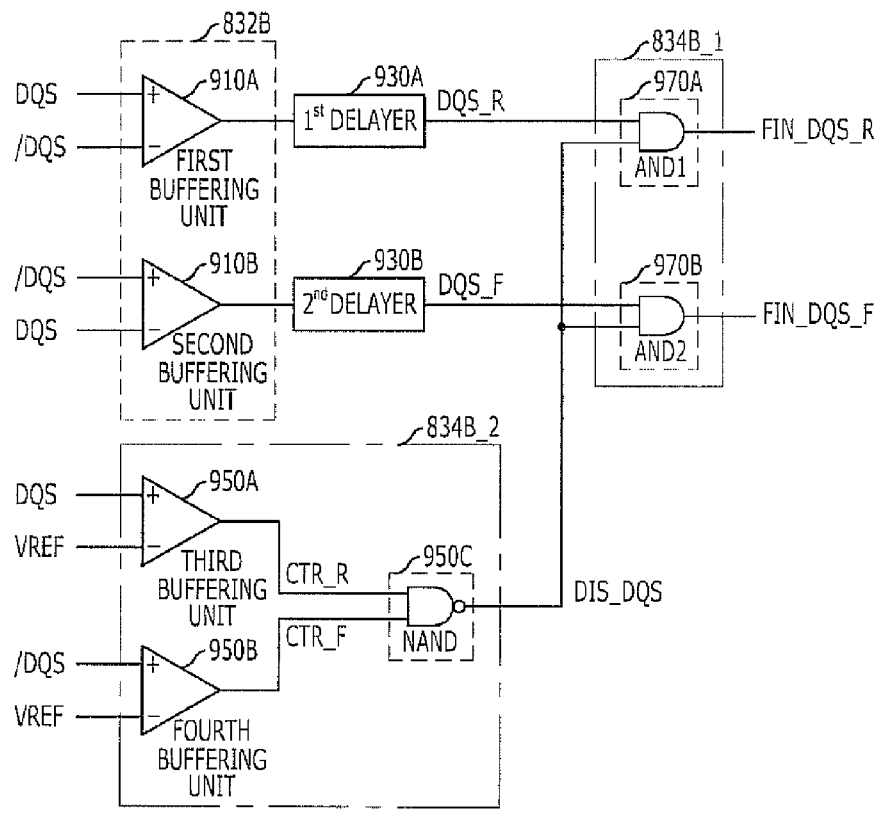
FIG. 9 illustrates a circuit diagram of a second receiver 832B, a control signal generation unit 834B_2, and a strobe signal output unit 834B_1 shown in FIG. 8.

FIG. 9 illustrates the second receiver 832B, the control signal generation unit 834B_2, and the strobe signal output unit 834B_1. The second receiver 832B includes a first buffering unit 910A and a second buffering unit 910B, and the first and second buffering units 910A and 910B receive the first and second data strobe signals DQS and /DQS and performs buffering. To be specific, the first buffering unit 910A receives the first data strobe signal DQS through a positive (+) terminal and the second data strobe signal /DQS through a negative (−) terminal and performs a buffering operation, and the second buffering unit 910B receives the second data strobe signal /DQS through the positive (+) terminal and the first data strobe signal DQS through the negative terminal and performs a buffering operation. Output signals of the first and second buffering units 910A and 910B pass through first and second delayers 930A and 930B and become a rising data strobe signal DQS_R which corresponds to the first data strobe signal DQS and a falling rising data strobe signal DQS_F which corresponds to the second data strobe signal /DQS, respectively. Herein, the first and second delayers 930A and 930B compensates for delay time taken until the strobe control signal DIS_DQS is generated from the first and second data strobe signals DQS and /DQS.

The control signal generation unit 834B_2 includes a third buffering unit 950A, a fourth buffering unit 950B, and a control signal output unit 950C.

The third buffering unit 950A receives the first data strobe signal DQS through a positive (+) terminal and a reference voltage VREF through a negative (−) terminal and performs a buffering operation to thereby generate a rising control signal CTR_R which corresponds to the first data strobe signal DQS. The fourth buffering unit 950E receives the second data strobe signal /DQS through a positive (+) terminal and a reference voltage VREF through a negative (−) terminal and performs a buffering operation to thereby generate a falling control signal CTR_F which corresponds to the second data strobe signal /DQS. Herein, the third buffering unit 950A and the fourth buffering unit 950B are needed to generate the rising control signal CTR_R and the falling control signal CTR_F. They also correspond to the first buffering unit 910A and the second buffering unit 910B and reflect the same delay time into the first and second data strobe signals DQS and /DQS.

Subsequently, the control signal output unit 950C generates a strobe control signal DIS_DQS in response to the rising and falling control signals CTR_R and CTR_F. The control signal output unit 950C includes a NAND gate for receiving the rising and falling control signals CTR_R and CTR_F and generating a strobe control signal DIS_DQS.

Meanwhile, the strobe signal output unit 834B_1 limits the rising and falling data strobe signals DQS_R and DQS_F to a strobe control signal DIS_DQS to thereby generate a final rising data strobe signal FIN_DQS_R and a final falling data strobe signal FIN_DQS_F. The strobe signal output unit 834B_1 includes a first strobe signal output element 970A and a second strobe signal output element 970B.

The first strobe signal output element 970A limits the rising data strobe signal DQS_R to a strobe control signal DIS_DQS to thereby generate a final rising data strobe signal FIN_DQS_R. The first strobe signal output element 970A includes a first AND gate AND1. The second strobe signal output element 970B limits the falling data strobe signal DQS_F to a strobe control signal DIS_DQS to thereby generate a final falling data strobe signal FIN_DQS_F. The second strobe signal output element 970B includes a second AND gate AND2.

Figure 10:
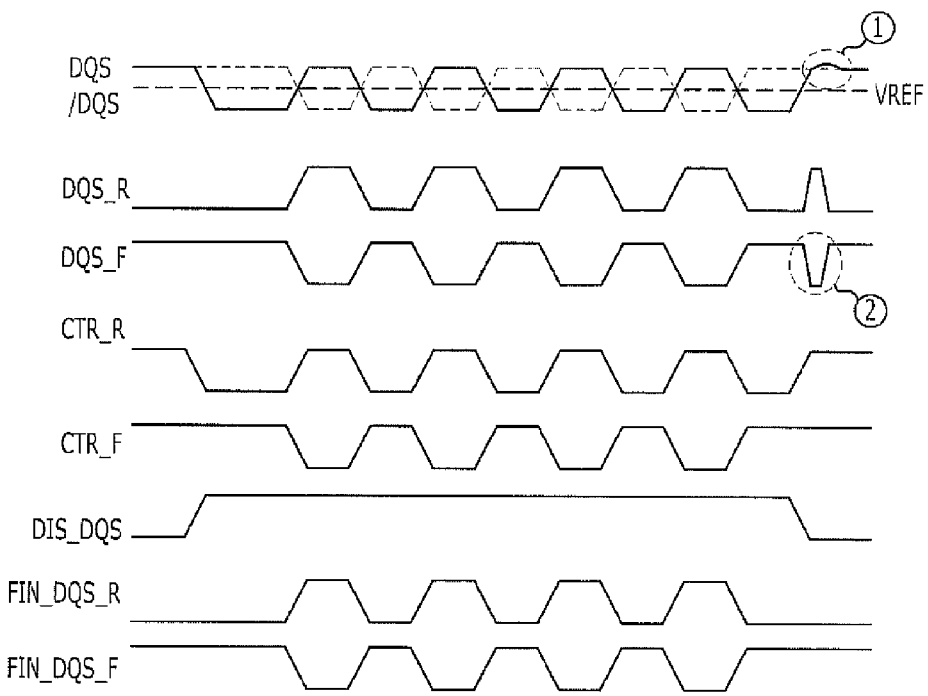
FIG. 10 is a waveform diagram illustrating major signals inputted/outputted to/from each circuit of FIG. 9.

FIG. 10 is a waveform diagram illustrating major signals inputted/outputted to/from each circuit of FIG. 9. Referring to FIGS. 9 and 10, the first and second data strobe signals DQS and /DQS swing to a voltage level corresponding to a power source voltage and are transferred. Herein, the termination level corresponds to a high power source voltage. Therefore, the first and second data strobe signals DQS and /DQS perform toggling in a pre-amble section and a section where a data DAT is transferred. In other sections, they maintain the termination level. In particular, the data strobe signal DQS performs toggling according to a low power source voltage in a pre-amble section and the second data strobe signal /DQS maintains a high power source voltage in the pre-amble section. Herein, the data strobe signal DQS may have a ring-back effect, which is marked as ①.

Subsequently, the first and second data strobe signals DQS and /DQS are buffered in the second receiver 832B to thereby generate rising and falling data strobe signals DQS_R and DQS_F. Herein, the rising and falling data strobe signals DQS_R and DQS_F have a glitch phenomenon, which is marked as ②, caused by a ring-back effect of the first and second data strobe signals DQS and /DQS.

Meanwhile, the control signal generation unit 834B_2 buffers the first and second data strobe signals DQS and /DQS and the reference voltage VREF to thereby generate a rising control signal CTR_R and a falling control signal CTR_F. Then, the control signal generation unit 834B_2 combines them by using, e.g., a NAND gate, and generates a strobe control signal DIS_DQS. Herein, since the logic levels of the rising and falling control signals CTR_R and CTR_F are determined based on a reference voltage VREF which is different from a termination level, for example, a voltage level of a half of the termination level, the rising and falling control signals CTR_R and CTR_F are not affected by the ring-back effect occurring in the first and second data strobe signals DQS and /DQS.

The strobe control signal DIS_DQS generated based on the rising and falling control signals CTR_R and CTR_F in accordance with an embodiment of the present invention limits an activation section of the rising and falling data strobe signals DQS_R and DQS_F. In short, the strobe control signal DIS_DQS performs a control to make the rising and falling data strobe signals DQS_R and DQS_F perform a toggling only in a needed section. Herein, the strobe control signal DIS_DQS is activated at a time point when the strobe control signal DIS_DQS enters a pre-amble section and inactivated at a time point when the first and second data strobe signals DQS and /DQS are inactivated.

The strobe signal output unit 834B_1 outputs the final rising and falling data strobe signals FIN_DQS_R and FIN_DQS_F in an activation section of the strobe control signal DIS_DQS, that is, in a section where the strobe control signal DIS_DQS is activated to a logic high level. As shown in the drawing, the glitch phenomenon marked as ②0 is removed from the final rising and falling data strobe signals FIN_DQS_R and FIN_DQS_F.

As described above, the semiconductor memory device fabricated in accordance with an embodiment of the present invention uses the first and second data strobe signals DQS and /DQS to generate a strobe control signal DIS_DQS. Since the ring-back controller 834B for removing the glitch phenomenon may be designed to be simple and the number of delay circuits that are added for synchronization with a dock signal may be reduced, it is possible to reduce the chip area of a semiconductor memory device. Also, since the final rising and falling data strobe signals FIN_DQS_R and FIN_DQS_F becomes free of the glitch phenomenon, the semiconductor memory device does not malfunction, which otherwise may be caused by the glitch phenomenon, although the semiconductor memory device operates at a high frequency. Although not illustrated in the drawings, the glitch phenomenon may occur even in an embodiment of the present invention before a pre-amble section. However, since the activation section of the strobe control signal DIS_DQS is limited to a logic low level before the pre-amble section, the glitch phenomenon occurring before the pre-amble section may not affect the generation of the final rising and falling data strobe signals FIN_DQS_R and FIN_DQS_F.

It is possible to additionally design a circuit that can broaden the Logic low pulse width of the rising and falling control signals CTR_R and CTR_F in order to generate a stable strobe control signal DIS_DQS based on the rising and falling control signals CTR_R and CTR_F.

While the present invention has been described with respect to the specific embodiments, it will be apparent to those skilled in the art that various changes and modifications may be made without departing from the spirit and scope of the invention as defined in the following claims.

The technology of the present invention can secure stable synchronization operation of a first data strobe signal, a second data strobe signal, which is an inverted signal of the first data strobe signal, and data by generating a strobe control signal based on the first and second data strobe signals and removing a glitch phenomenon caused by a ring-back effect of the first and second data strobe signals based on the generated strobe control signal.

Also, the technology of the present invention can minimize a chip area and power consumption of a semiconductor memory device by simplifying a circuit for generating a strobe control signal and removing a delay circuit which used to be added for a synchronization operation of a clock signal in a conventional semiconductor memory device.

What is claimed is:

1. A circuit for generating a data strobe signal, comprising:
   a control signal generation unit configured to generate a strobe control signal defining an activation time period where a first data strobe signal and a second data strobe signal are toggled; and
   a strobe signal output unit configured to output the first and second data strobe signals as a final strobe signal in the activation time period where the strobe control signal is activated,
   wherein the second data strobe signal is an inverted signal of the first data strobe signal.

2. The circuit of claim 1, wherein the activation time period where the first and second data strobe signals are toggled includes a pre-amble section of the first and second data strobe signals.

3. The circuit of claim 1, wherein the strobe signal output unit comprises:
   a first buffering unit configured to generate a rising data strobe signal corresponding to the first data strobe signal by buffering the first and second data strobe signals; and
   a second buffering unit configured to generate a falling data strobe signal corresponding to the second data strobe signal by buffering the first and second data strobe signals.

4. The circuit of claim 3, further comprising:
   a delayer configured to delay output signals of the first and second buffering units and generate the rising data strobe signal and the falling data strobe signal.

5. The circuit of claim 1, wherein the control signal generation unit further includes:
   a third buffering unit configured to generate a rising control signal by receiving and buffering the first data strobe signal and a reference voltage;
   a fourth buffering unit configured to generate a falling control signal by receiving and buffering the second data strobe signal and the reference voltage; and
   a control signal output unit configured to generate the strobe control signal in response to the rising control signal and the falling control signal.

6. The circuit of claim 5, wherein the first and second data strobe signals have a termination level corresponding to a power source voltage.

7. The circuit of claim 6, wherein the reference voltage has a predetermined voltage level which is different from the termination level.

8. The circuit of claim 1, wherein the final strobe signal includes a final rising strobe signal corresponding to the first data strobe signal and a final falling strobe signal corresponding to the second data strobe signal.

9. The circuit of claim 8, wherein the strobe signal output unit includes:
   a first strobe signal output element configured to control the first data strobe signal based on the strobe control signal and generate the final rising strobe signal; and
   a second strobe signal output element configured to control the second data strobe signal based on the strobe control signal and generate the final falling strobe signal.

10. A method for generating a data strobe signal, comprising:
- buffering a first data strobe signal and a second data strobe signal which is an inverted signal of the first data strobe signal;
- generating a strobe control signal defining an activation time period where the first data strobe signal and the second data strobe signal are toggled; and
- outputting an output signal of the process of buffering the first data strobe signal and the second data strobe signal as a final strobe signal in the activation time period where the strobe control signal is activated.

11. The method of claim 10, wherein the generating a strobe control signal includes:
- generating a rising control signal by buffering the first data strobe signal and a reference voltage;
- generating a falling control signal by buffering the second data strobe signal and the reference voltage;
- outputting the strobe control signal in response to the rising control signal and the falling control signal.

12. The method of claim 11, wherein the generating a strobe control signal further includes:
- terminating the first and second data strobe signals at a level corresponding to a power source voltage.

13. The method of claim 12, wherein the reference voltage has a predetermined voltage level that is different from the termination level.

14. A memory system, comprising:
- a memory control device configured to output a data having a termination level corresponding to a power source voltage and a data strobe signal; and
- a memory device configured to generate a strobe control signal by buffering a reference voltage having a predetermined voltage level and the data strobe signal, output the data strobe signal as a final strobe signal in an activation time period where the strobe control signal is activated, and synchronize the data in response to the final strobe signal.

15. The memory system of claim 14, wherein each of the memory control device and the memory device includes a termination means configured to operate the data and the data strobe signal at the termination level.

16. The memory system of claim 15, wherein the termination means includes a resistor interposed between each transmission line through which the data and the data strobe signal are transferred and a power source voltage unit.

17. The memory system of claim 14, wherein the data strobe signal includes a first data strobe signal and a second data strobe signal which is an inverted signal of the first data strobe signal, and the memory device includes:
- a control signal generation unit configured to generate the strobe control signal in the activation time period where the first and second data strobe signals are toggled;
- a strobe signal output unit configured to output the first and second data strobe signals as a final strobe signal in the activation time period where the strobe control signal is activated; and
- a synchronizer configured to synchronize the data in response to the final strobe signal.

18. The memory system of claim 17, wherein the time period where the first and second data strobe signals are toggled includes a pre-amble section of the first and second data strobe signals.

19. The memory system of claim 17, wherein the memory device includes:
- a first buffering unit configured to generate a rising data strobe signal corresponding to the first data strobe signal by buffering the first and second data strobe signals; and
- a second buffering unit configured to generate a falling data strobe signal corresponding to the second data strobe signal by buffering the first and second data strobe signals, wherein the strobe signal output unit is configured to receive the rising data strobe signal and the falling data strobe signal as the first and second data strobe signals.

20. The memory system of claim 19, further comprising:
- a delayer configured to delay output signals of the first and second buffering units as much as a delay amount of the strobe control signal and the first and second data strobe signals.

21. The memory system of claim 17, wherein the control signal generation unit further includes:
- a third buffering unit configured to generate a rising control signal by receiving and buffering the first data strobe signal and the reference voltage;
- a fourth buffering unit configured to generate a falling control signal by receiving and buffering the second data strobe signal and the reference voltage; and
- a control signal output unit configured to generate the strobe control signal in response to the rising control signal and the falling control signal.

22. The memory system of claim 17, wherein the final strobe signal includes a final rising strobe signal corresponding to the first data strobe signal and a final falling strobe signal corresponding to the second data strobe signal.

23. The memory system of claim 22, wherein the strobe signal output unit includes:
- a first strobe signal output element configured to control the first data strobe signal in response to the strobe control signal and generate the final rising strobe signal; and
- a second strobe signal output element configured to control the second data strobe signal in response to the strobe control signal and generate the final falling strobe signal.

24. The memory system of claim 14, wherein the reference voltage has a predetermined voltage level which is different from the termination level.

* * * * *

UNITED STATES PATENT AND TRADEMARK OFFICE
CERTIFICATE OF CORRECTION

| | | |
|---|---|---|
| PATENT NO. | : 8,009,492 B2 | Page 1 of 1 |
| APPLICATION NO. | : 12/614950 | |
| DATED | : August 30, 2011 | |
| INVENTOR(S) | : Choung-Ki Song et al. | |

It is certified that error appears in the above-identified patent and that said Letters Patent is hereby corrected as shown below:

On the Title Page

Change INVENTORS Item (75) as follows:

INVENTORS
   Choung-Ki Song, Gyeonggi-do (KR);
   Sang-Sic Yoon, Gyeonggi-do (KR)

Signed and Sealed this
Fourth Day of October, 2011

David J. Kappos
*Director of the United States Patent and Trademark Office*